(12) United States Patent
Takeda

(10) Patent No.: US 7,750,249 B2
(45) Date of Patent: Jul. 6, 2010

(54) MULTILAYER PRINTED CIRCUIT BOARD AND METHOD OF MANUFACTURING SAME

(75) Inventor: Tsutomu Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 304 days.

(21) Appl. No.: 12/042,484

(22) Filed: Mar. 5, 2008

(65) Prior Publication Data

US 2008/0218985 A1 Sep. 11, 2008

(30) Foreign Application Priority Data

Mar. 7, 2007 (JP) .............................. 2007-057926

(51) Int. Cl.
*H01R 12/04* (2006.01)
(52) U.S. Cl. ......................................... 174/262; 29/832
(58) Field of Classification Search ......... 174/262–264; 361/735, 736, 768; 29/831, 830, 842, 846, 29/847

See application file for complete search history.

(56) References Cited

FOREIGN PATENT DOCUMENTS

| JP | 2001244635 A | 9/2001 |
|----|--------------|--------|
| JP | 2001244636 A | 9/2001 |
| JP | 2002305377 A | 10/2002 |

*Primary Examiner*—Jinhee J Lee
*Assistant Examiner*—Abiy Getachew

(57) ABSTRACT

A printed circuit board is provided which is capable of shortening intervals among core layer vias and suppressing high impedance. After the core layer vias each having a cylindrical conducting layer are formed so that conducting portions come into contact with one another, a punching process is performed along a symmetric axis of each of four core layer vias so that a through-hole of a specified diameter passes through a core board to form the core layer vias separated from one another and the through-hole is filled with an insulator and a punching process is performed along a central axis of the through-hole filled with the insulator so as to pass through the core board to form the through-hole having a diameter being shorter than that of the through-hole and the conducting layer is formed on an inside wall of the through-hole to form the core layer via.

13 Claims, 13 Drawing Sheets

*42;Core Layer Via*

*42;Core Layer Via*

US 7,750,249 B2

MULTILAYER PRINTED CIRCUIT BOARD AND METHOD OF MANUFACTURING SAME

INCORPORATION BY REFERENCE

This application is based upon and claims the benefit of priority from Japanese Patent Application No. 2007-057926, filed on Mar. 7, 2007, the disclosure of which is incorporated herein in its entirely by reference.

BACKGROUND OF THE INVENTION

1. Field of the Invention

The present invention relates to a multilayer printed circuit board and a method for manufacturing the same, and more especially the multilayer printed circuit board such as a built-up printed circuit board and the method for manufacturing the same.

2. Description of the Related Art

Conventionally, an electronic device such as a computer device and communicating device generally includes a printed circuit board on which components such as SMDs (Surface Mount Devices) and through-hole mount devices are mounted.

In recent years, as electronic devices become highly functional, multilayer printed circuit boards are becoming more commonly used. For example, a built-up printed circuit board 101 serving as the multilayer printed board includes, as shown in FIG. 19, a core board 104, serving as a base, having a multilayer structure in which a plurality of conducting layers 102 and a plurality of insulating layers 103 are stacked and built-up layers 105 and 106 are formed on upper and lower sides of the core board 104.

Also, the built-up printed board 101 has core layer via holes (hereinafter, referred to as core layer vias) 109 passing through the plurality of conducting layers 102 and insulating layers 103 formed between the lower surface and upper surface of the core board 104, built-up layer via holes (hereinafter, referred to as built-up layer vias) 111a, 111b, and 111c also passing through the lower and upper surfaces of the built-up layers 105, and built-up layer vias 112a, 112b, and 112c passing through the lower and upper surfaces of the built-up layer 106, all of which are formed to establish connection between connecting terminals of the SMDs 107 each being an electronic device, and the conducting layers 102 serving as inner layers.

Each of the conducting layers 102 is made up of a signal layer, a power source layer, or a ground layer. Each of SMDs 107 is mounted on the built-up printed circuit board 101 in a state in which each corresponding connecting terminal is connected through solder to each of soldering pads 113 formed on a surface of each of the built-up layers 105 and 106.

In the built-up layers 105 and 106, a width (thickness) of each of the conducting layers and its interval (width of each of the insulating layers) can be made smaller until both the width and interval become about 15 μm. Moreover, a hole diameter of each of the built-up layer vias 111a, 111b, and 111c (112a, 112b, and 112c) used to establish connection among layers can be made smaller until the diameter becomes about 50 μm and, if the same signals are transmitted therethrough, a pitch among the built-up layer vias can be made smaller until the pitch becomes about 80 μm. This enables high density wiring.

On the other hand, in the core board 104, a width (thickness) of each of the conducting layers and its interval (width of an insulating layer) can be made smaller until both the width and interval become about 80 μm. Also, if the core board 104 is made up of 6 or more conducting layers stacked on one another, a hole diameter of each of the core layer vias 109 can be made smaller until the diameter becomes about 200 μm and its pitche can be made smaller until the pitch becomes about 700 μm.

Therefore, when the SDM 107 on an upper side (front side) is to be connected to the SDM 107 on a lower side (rear side) via each of the core layer vias 109, random pitches among the core layer vias 109 in the core board 104 are an obstacle to achieving high density wiring. Moreover, in the transmission of high-frequency signals in particular, since each of a signal line, power source line, or ground line is assigned at every pitch among the core layer vias 109, when a signal passes through each of the core layer vias 109, a distance of a path for a ground-return current is made long, as a result, causing high impedance.

In order to realize a reliable path for a ground return current of a signal passing through each of the core layer vias, technology is proposed in which each of the core layer vias is so configured as to have a coaxial structure made up of an inner via and outer via and the outer via is assigned to a ground line and inner via is assigned to a signal line (for example, Japanese Patent Application Laid-open Nos. 2001-244635, 2002-305377, and 2001-244636) and in which an outer layer of the coaxial structure is divided into two portions to use each of the portions as a signal line (for example, the above 2001-244636).

The above conventional technologies have a problem in that it is difficult to make a pitch among vias in the core layer sufficiently short. That is, in the above conventional technology, even if each of the core layer vias is so configured as to have a coaxial structure and the pitches among the vias are made short, the measure is not satisfactory enough to be contributable to high-density wiring. Also, even if an outer layer of the coaxial structure is divided into two portions, it is difficult to make the pitches sufficiently short and formation of the via of this type having the coaxial structure is not easy. Thus, both the suppression of high impedance during the transmission of high-frequency signals and the achievement of sufficiently short pitches among the vias in the conventional core layer are difficult.

SUMMARY OF THE INVENTION

In view of the above, it is an object of the present invention to provide a multilayer printed circuit board and its manufacturing method which are capable of suppressing high impedance during a transmission of high-frequency signals and of shortening intervals among vias in core layers.

According to a first aspect of the present invention, there is provided a method for manufacturing a multilayer printed circuit board on which electrical devices are mounted and a plurality of insulating layers and a plurality of conducting layers alternately are stacked and conducting paths are formed along an approximately vertical direction to the conducting layers, the method including:

a conducting path forming process of forming the conducting paths on the board on which the plurality of insulating layers and the plurality of conducting layers are alternately stacked and of forming a plurality of first conducting paths passing through the board and second conducting paths also passing through the board so as to be surrounded by the plurality of first conducting paths, wherein the conducting path forming process includes a first process of forming a plurality of cylindrical or pillar-shaped conducting portions at both ends of each main body of which edge conducting portions are formed on the board so that the edge conducting portions being adjacent to one another come near to or come into contact with one another at least within a specified distance, a second process of punching a center portions of regions in which the plurality of conducting portions is placed so that partial portions on the center portion sides of the conducting portions are removed and so that the edge conducting portions being adjacent to one another are at least separated from one another to form first through-holes so as to form the first conducting paths, a third process of forming, after the first through-holes are filled with an insulator, second through-holes each having a cross-sectional dimension being smaller than that of each of the first through-holes within the first through-holes filled with the insulator, and a fourth process of forming conducting layers in inner walls of the second through-holes so that the second conducting paths are formed.

In the foregoing, a preferable mode is one wherein, in the first process, the plurality of first conducting portions is formed so that the edge conducting portions being adjacent to one another come into contact with one another.

Also, a preferable mode is one wherein the edge conducting portions formed in the first process include approximately circular lands and, in the first process, the plurality of first conducting portions are formed so as to be overlapped by circular arcs each containing a circumference of each of the lands being adjacent to one another.

Also, a preferable mode is one wherein, in the first process, the plurality of first conducting portions is arranged annularly in places surrounding central portions.

Also, a preferable mode is one wherein the first conducting paths serve as signal wirings and the second conducting paths serve as ground wirings.

Also, a preferable mode is one wherein, on upper surface sides and lower surface sides of the board serving as a core board are formed built-up layers.

Also, a preferable mode is one wherein connecting terminals mounted on surface mount devices (SMDs) being the electrical devices are connected to the specified conducting layers through the first conducting paths and the second conducting paths.

According to a second aspect of the present invention, there is provided a multilayer printed circuit board on which electrical devices are mounted and a plurality of insulating layers and a plurality of conducting layers alternately are stacked and conducting paths are formed along an approximately vertical direction to the conducting layers, including:

a plurality of conducting paths formed on the board on which the plurality of insulating layers and the plurality of conducting layers are alternately stacked which make up the conducting paths and pass through the board; and second conducting paths surrounded by the plurality of first conducting paths, wherein, at both ends of each cylindrical and pillar-shaped main body of the first conducting paths and second conducting paths are formed edge conducting portions, wherein, in the plurality of first conducting paths, the edge conducting portions being adjacent to one another are arranged so as to be separated from one another and the second conducting paths are placed in center portions of regions in which each of the plurality of first conducting portions is arranged with a specified distance kept from each of the first conducting paths, and wherein each of portions in the center portions of circumferences of at least the edge conducting portions of the first conducting paths is formed so as to have a shape corresponding to a shape of a circumference of the edge conduction portions of the second conduction paths with the specified distance kept from the second conducting paths.

In the foregoing, a preferable mode is one, wherein the edge conducting portions of the first conducting paths are formed so that portions in the center of each of approximately circular lands of the edge conducting portions are removed and the plurality of first conducting paths is formed so that partial portions of circular arcs each containing a circumference of each of the lands being adjacent to one another come into contact with one another or overlap.

Also, a preferable mode is one wherein the plurality of first conducting paths is arranged annularly in portions surrounding the center portions.

Also, a preferable mode is one wherein the first conducting paths make up signal wirings and the second conducting paths make up ground wirings.

Also, a preferable mode is one, wherein, on upper surface sides and lower surface sides of the board serving as a core board are formed built-up layers.

Furthermore, a preferable mode is one wherein connecting terminals mounted on surface mount devices (SMD) being the electrical devices are connected to the specified conducting layers through the first conducting paths and the second conducting paths.

With the above configurations, the plurality of first conducting portions is formed on the board so that the edge conducting portions being adjacent to one another come near to or come into contact with one another within at least a specified distance. The center portions in regions having a plurality of first conducting portions are punched so that the partial portions on the side of center portions of the first conducting portions are removed and the edge conducting portions being adjacent to one another are at least separated from one another and, as a result, the first through-holes are formed to achieve the first conducting paths and are filled with the insulator and, then, the second through-holes each having a diameter in cross section being smaller than that of each of the first through-holes are formed inside the first through-holes filled with the insulator to realize the second conducting paths. Therefore, the interval between the first and second conducting portions can be made small and high impedance can be suppressed in transmission of high-frequency signals.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EXEMPLARY EMBODIMENTS

Best modes of carrying out the present invention will be described in further detail using various exemplary embodiments with reference to the accompanying drawings. A plurality of first conducting portions is formed on a board so that edge conducting portions being adjacent to one another come near to or come into contact with one another within at least a specified distance. Center portions in regions having the plurality of first conducting portions are punched so that partial portions on sides of the center portions of the first conducting portions and edge conducting portions being adjacent to one another are at least separated from one another and, as a result, first through-holes are formed to achieve first conducting paths and the first through-holes are filled with an insulator and, then, the second through-holes each having a diameter in cross section being smaller than that of each of the first through-holes is formed inside the first through-holes filled with the insulator to realize a second conducting path. By the above method and configurations, the object of the invention is achieved that, for example, an interval between core layer vias being the interval between the first and second conducting portions can be made small and high impedance can be suppressed in a transmission of high-frequency signals.

First Exemplary Embodiment

Figure 1:
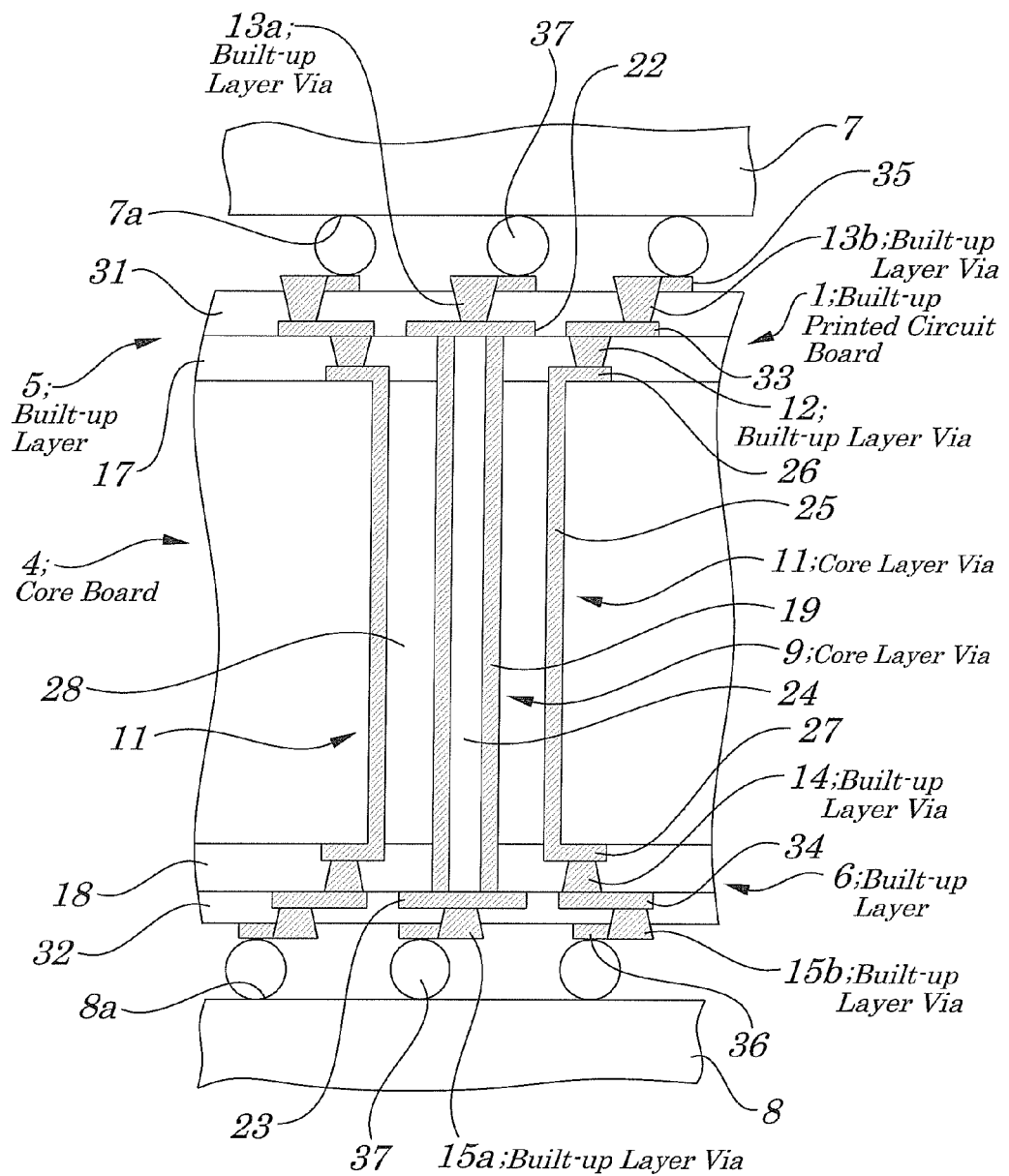
FIG. 1 is a cross sectional view showing configurations of a built-up printed circuit board according to a first exemplary embodiment of the present invention.
Figure 2:
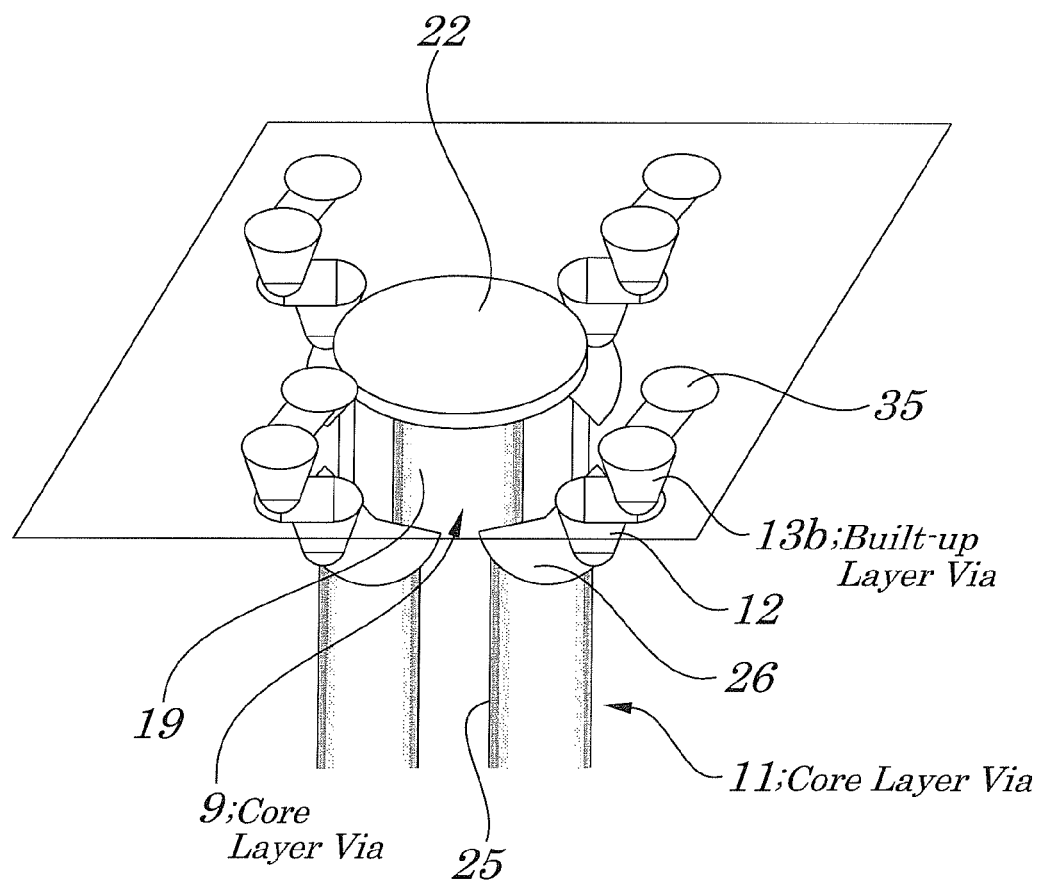
FIG. 2 is a perspective view explaining configurations of the built-up printed circuit board of FIG. 1.

FIG. 1 is a cross-sectional view showing configurations of a built-up printed circuit board of the first exemplary embodiment of the present invention. FIG. 2 is a perspective view explaining configurations of the built-up printed circuit board of FIG. 1. FIGS. 3A to 6 are process diagrams showing a method for manufacturing the built-up printed circuit board of FIG. 1. FIGS. 7 to 12 are explanatory diagrams showing the method for manufacturing the built-up printed circuit board of FIG. 1.

The built-up printed circuit board 1 serving as a multilayer printed circuit board of the first exemplary embodiment is implemented in electronic devices such as computers and communicating devices and includes, as shown in FIGS. 1 and 2, a core board 4 having a multilayer structure in which a plurality of conducting layers and a plurality of insulating layers are stacked and built-up layers 5 and 6 formed respectively on an upper side (front side) and a lower side (rear side) of the core board 4. The core board 4 includes, as a conducting layer, a signal layer, a power source layer, and a ground layer.

The built-up printed circuit board 1 also includes core layer vias 9, 11, 11, ..., each of which makes up each of conducting paths formed along a vertical direction between a lower surface and an upper surface of the core board 4 used to establish connection between corresponding connecting terminals 7a and 8a of, for example, the SMDs 7 and 8 being electronic devices and passes through a plurality of conducting layers and a plurality of insulating layers, built-up layer vias 12, 12, ..., 13a, 13b, ..., each of which makes up each of conducting paths between a lower surface and an upper surface of the built-up layer 5 and built-up layer vias 14, 14, ..., 15a, 15b, 15b, ..., each of which makes up each of conducting paths between a lower surface and an upper surface of the built-up layer 6.

The built-up printed circuit board 1 of the first exemplary embodiment also has four core layer vias 11, 11, ..., all of which make up signal lines, each having an approximately cylindrical-shaped conducting layer being circular-arc shaped in its cross section in a manner to surround each of the core layer vias 9 making up a ground wiring and having an approximately cylindrical-shaped conducting layer. Also, each of the core layer vias 9 is formed as each of approximately cylindrical-shaped through-holes passing through the core board 4 and insulating layers 17 and 18 placed respectively inside the built-up layers 5 and 6. On an inner wall surface of each of the through-holes is formed a conducting layer 19 made up of a metal plated layer. At both ends of each of the through-holes is formed disk-shaped conducting portions (via lands) 22 and 23 made up of a metal plated layer so as to stop up each of the through-holes and the through-holes are filled with an insulator 24 made of a resin such as an epoxy resin or polyimide resin.

Moreover, each of the core layer vias 11 has a conducting layer 25 made up of a metal plated layer formed on a concave inner surface of its wall surface portion being arc-shaped in cross section passing through the core board 4. The conducting layer 25 is placed in a neighboring position outside the core layer via 9 in a manner in which the concave surface is directed toward the core layer via 9. At both ends of each of the core layer vias 11 are formed conducting portions 26 and 27 made up of a metal plated layer and space between each of the core layer vias 11 and each of the core layer vias 9 and space between the core layer vias 11 being adjacent to one another are filled with an insulator 28 made of a resin for separation.

Each of the core layer vias 11, 11, ... is formed so that a center of a circular arc (center of a circle containing the above arc) is arranged, when seen from a plane direction, at an apex of a square whose center is a center of the through-hole of each of the core layer vias 9 and so that the central axis of the circular arc is commonly used as a central axis of the above through-hole and so that the conducting portion 25 and conducting portions 26 and 27 each having a circular-arc shaped circumference are scooped out by a cylindrical surface having a diameter being a bit larger than that of an outer circumference of the conducting layer 19. Moreover, in the first exemplary embodiment, each of the core layer vias 11, 11, . . . is placed in a manner in which circles containing a circular-arc shaped circumference of the conducting portion 26 (27) are in contact with one another.

Each of the built-up layer vias 12 is formed on an inside insulating layer 17 making up the built-up layer 5 and each of built-up layer vias 13a (or 13b) is formed on an outside insulating layer 31 making up the built-up layer 5. Also, each of the built-up layer vias 12 is electrically connected to each of corresponding core layer vias 11. Each of the built-up layer vias 12 is also electrically connected to each of the built-up layer vias 13b through each of conducting portions 33 being a metal plated layer. Also, each of the built-up layer vias 13a is electrically connected to the core layer vias 9 through the conducting layer 22 made up of a metal plated layer (cap plating) formed in the same layer as the conducting portions 33.

Each of the built-up layer vias 14 is formed in each of the inside insulating layers 18 of the built-up layer 6 and each of the built-up layer vias 15a (15b) is formed in each of the outside insulating layers 32 of the built-up layer 6. Also, each of built-up layer vias 14 is electrically connected to each of corresponding core layer vias 11 and each of the built-up layer vias 14 is also electrically connected to each of built-up layer vias 15b through each of conducting portions 34 being a metal plated layer. Moreover, each of built-up layer vias 15a is electrically connected to the core layer vias 9 through the conducting portion 33 being a metal plated layer (cap plating) formed in the same layer as the conducting portions 23.

The SMD 7 (or 8) is connected to the built-up printed circuit board 1 by solder 37 used to connect the soldering pad 35 (36) formed on an upper surface (lower surface) of the built-up layer 5 (or 6) to the corresponding connecting terminal 7a (or 8a). In the exemplary embodiment, the core layer vias 9 and built-up layer vias 13a and 15a make up ground lines and the core layer vias 11, built-up layer vias 12, 14, 13b and 15b make up signal lines, all of which are used to connect the connecting terminals 7a of the SMD 7 to the connecting terminals 8a of the SMD 8.

Figure 3A:
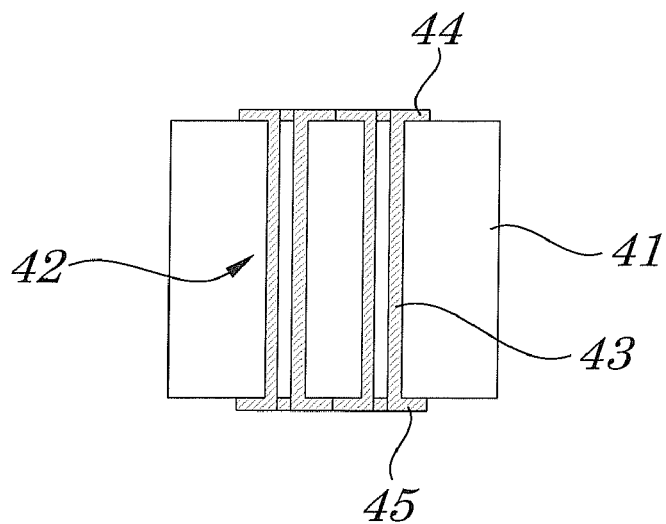
FIGS. 3A to 3C are process diagrams showing a method for manufacturing the built-up printed circuit board of FIG. 1.
Figure 6A:
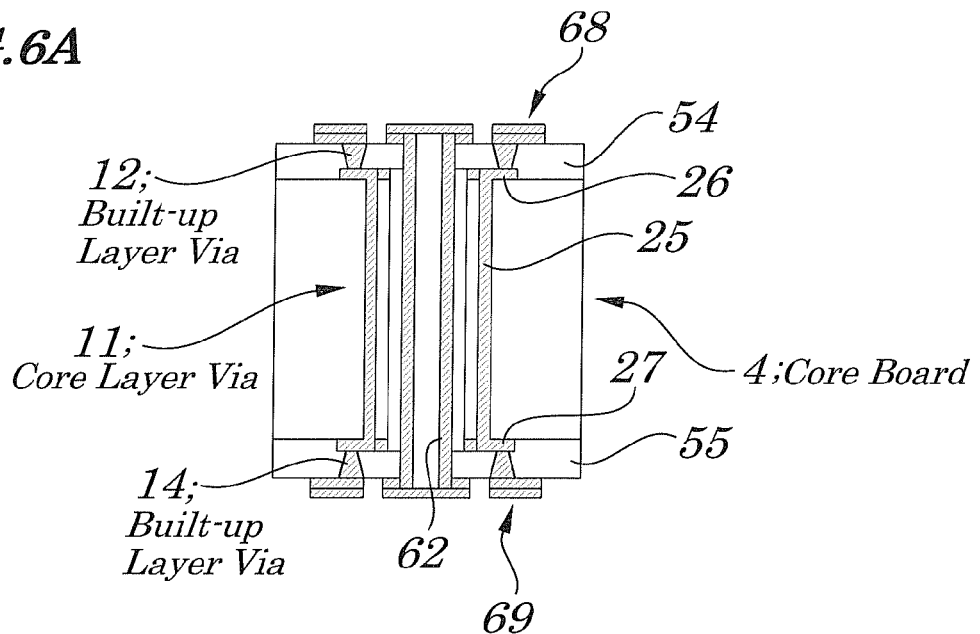
FIGS. 6A and 6B are process diagrams showing the method for manufacturing the built-up printed circuit board of FIG. 1.
Figure 6B:
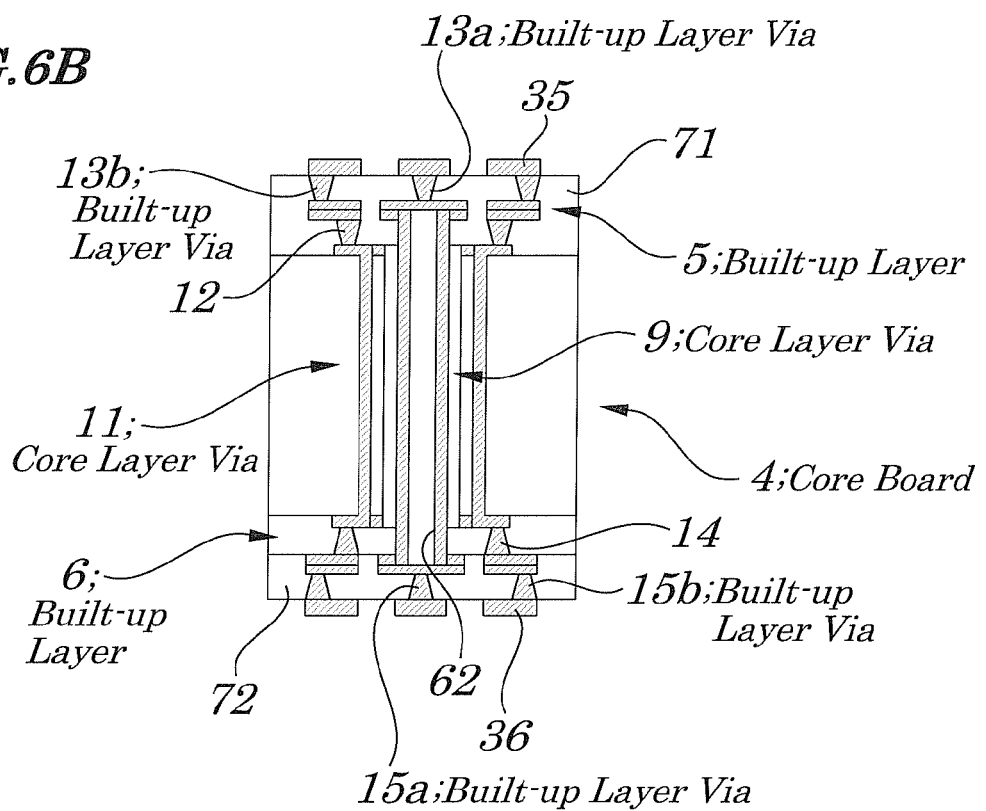
Figure 7:
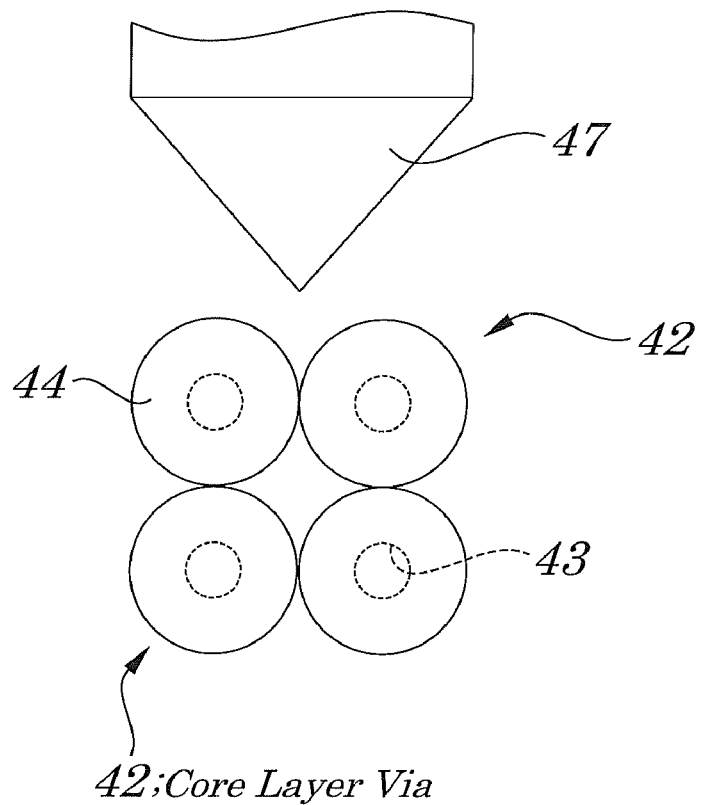
FIG. 7 is an explanatory diagram showing a method for manufacturing the built-up printed circuit board of FIG. 1.
Figure 8:
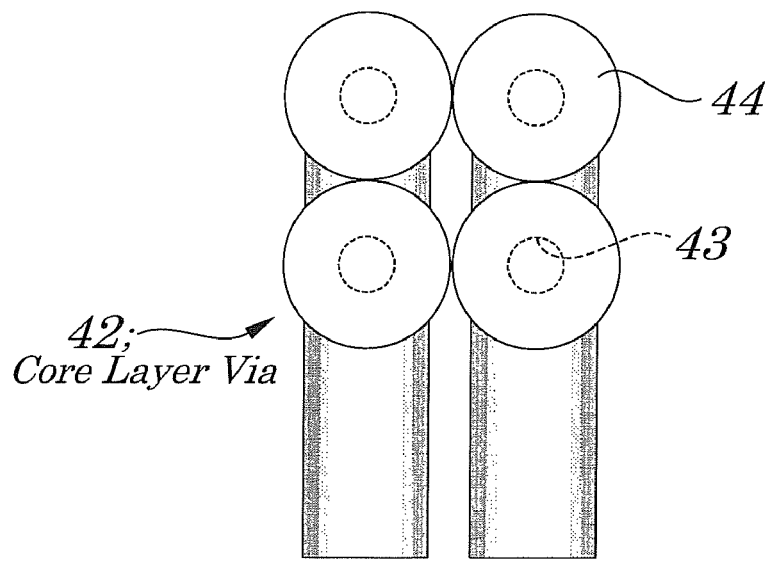
FIG. 8 is an explanatory diagram showing the method for manufacturing the built-up printed circuit board of FIG. 1.

Next, by referring to FIGS. 3A to 12, the method for manufacturing the built-up printed circuit board having the above configurations. First, as shown in FIGS. 3A, 7, and 8, four core layer vias 42, 42, . . . are formed so as to come near to one another in a core board 41 having a multilayer structure in which a plurality of conducting layers and a plurality of insulating layers are stacked.

In each of core layer vias 42, a conducting layer 43 passing through the core board 41 is formed which is made up of a metal plated layer being cylindrical-shaped in cross section and at both ends of each of core layer vias 42 are formed conducting portions 44 and 45 made up of a metal plated layer (cap plating). Moreover, the conducting layer 43 is filled with an insulator made of a resin. Each of the core layer vias 42, 42, . . . is formed so that the conducting portions 44, 44 (or 45, 45) are in contact with one another and so that a central axis of the cylindrical-shaped conducting layer 43 is positioned, when seen from a plane direction, at an apex of a square.

Figure 3B:
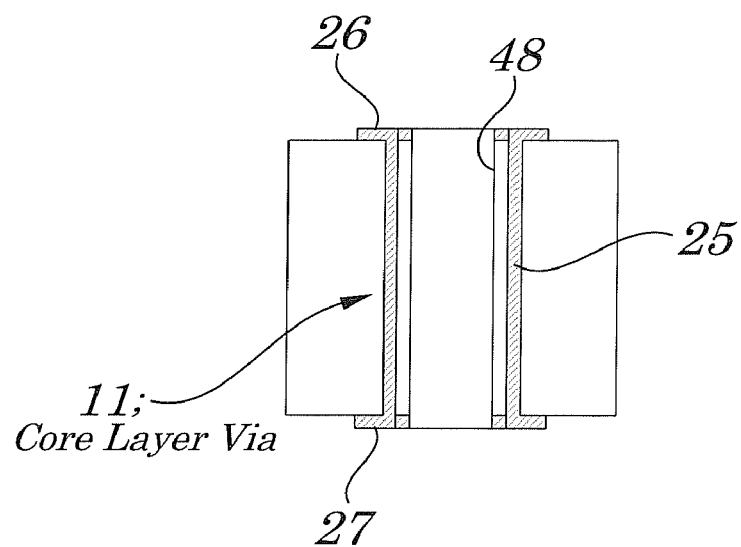
Figure 9:
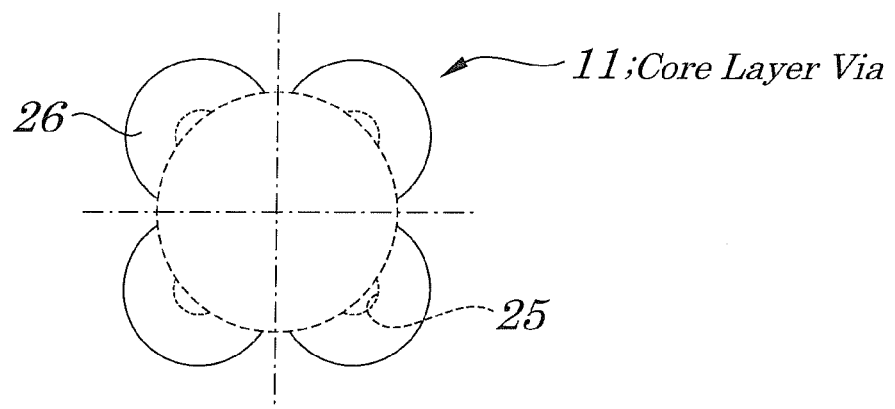
FIG. 9 is an explanatory diagram showing the method for manufacturing the built-up printed circuit board of FIG. 1.
Figure 10:
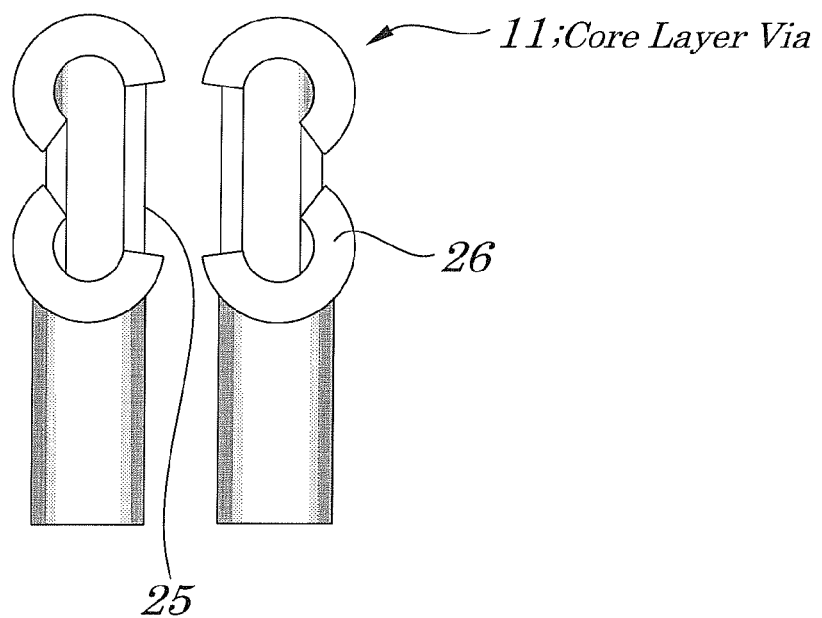
FIG. 10 is an explanatory diagram showing the method for manufacturing the built-up printed circuit board of FIG. 1.
Figure 11:
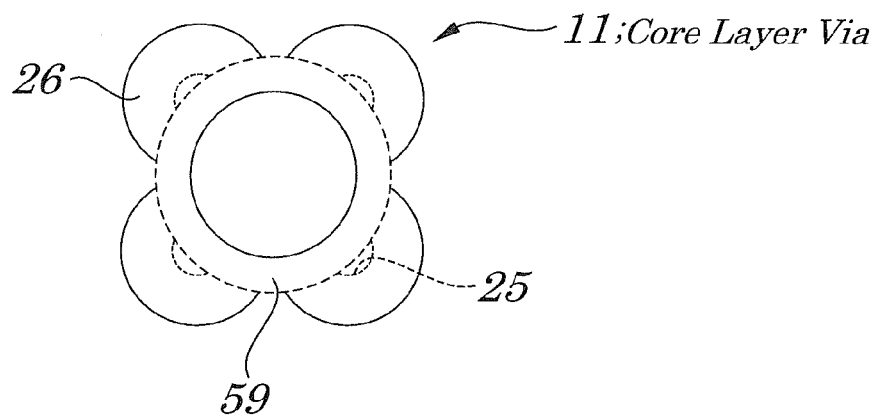
FIG. 11 is an explanatory diagram showing the method for manufacturing the built-up printed circuit board of FIG. 1.

Next, as shown in FIGS. 3B and 7, by using a drill, a punching process is performed so that a hole passes through the core board 41, taking a sight at a symmetric axis (axis passing through a center of the above square) of the four core layer vias 42, 42, . . . and along the symmetric axis to form a through-hole 48 having a radius being about a distance between the above symmetric axis and a central axis of each of the conducting layers 43. As a result, as shown in FIGS. 9 and 10, regions on the above symmetric axis of the conducting layers 43 and conducting portions 44 and 45 of the core layer vias 42, 42, 42, . . . are scooped out and the core layer vias 11, 11, . . . each having the conducting layer 25 being circular-arc shaped in cross section which passes through the core board 41 and is formed so that its concave surface is directed on the symmetric axis and conducting portions 26 and 27 made up of a metal plated layer formed at both the sides of the conducting layer 25 are formed in a state separated from one another.

Figure 3C:
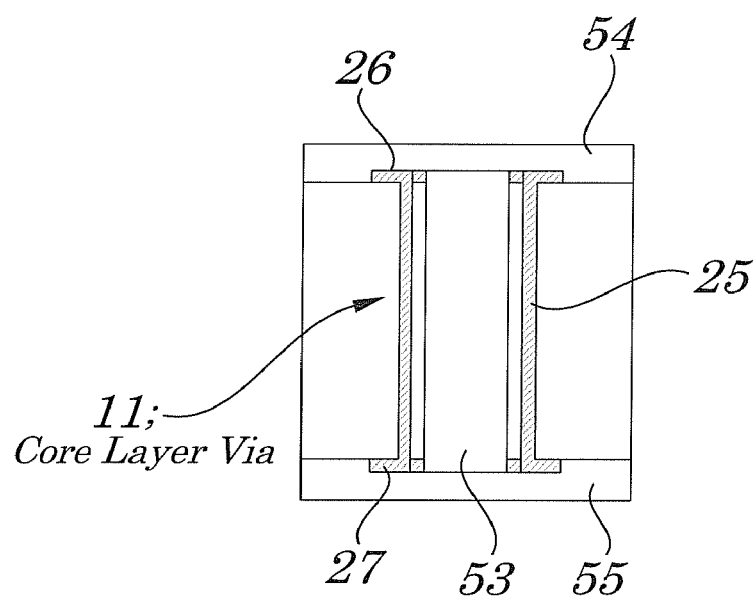
Figure 4A:
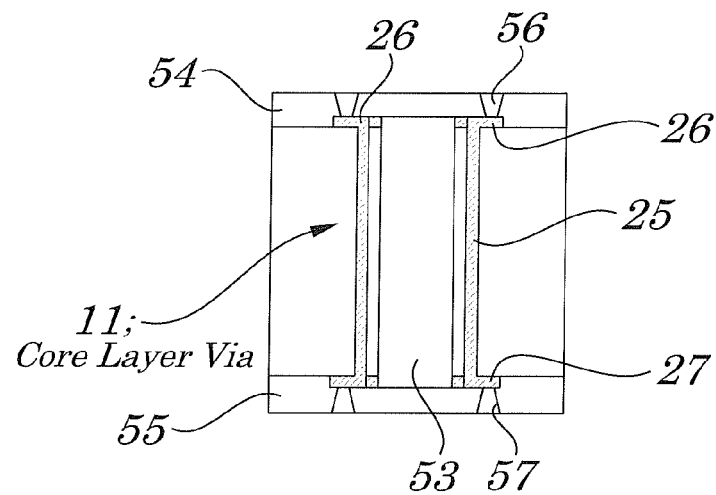
FIGS. 4A to 4C are process diagrams showing the method for manufacturing the built-up printed circuit board of FIG. 1.

Then, as shown in FIG. 3C, after a through-hole 48 has been filled with an insulator 53, insulating layers 54 and 55 are formed. Next, as shown in FIG. 4A, by a punching process, apertures 56 and 57 for built-up vias are formed in the insulating layers 54 and 55.

Figure 4B:
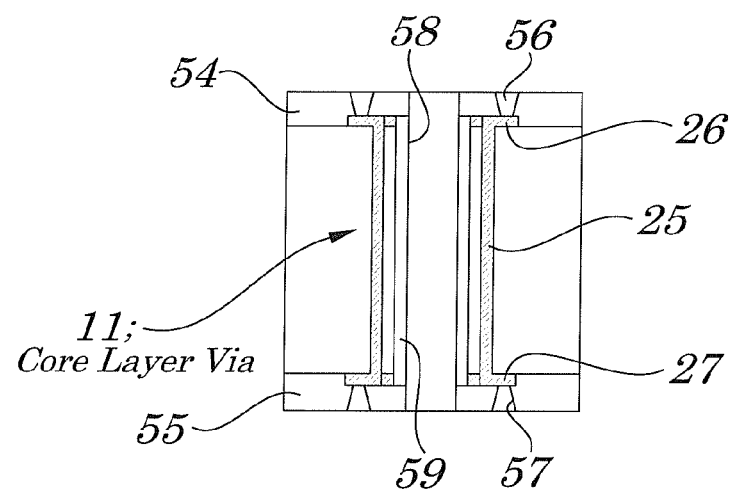

Next, as shown in FIG. 4B, a punching process is performed so as to pass through the insulating layers 54 and 55 and the core board 41 along a central axis of the through-hole 58 filled with the insulator in order to form a through-hole having a specified diameter being smaller than that of the through-hole 58. On an inner wall is left an insulating layer 59 (shown in FIG. 11) made of a resin.

Figure 4C:
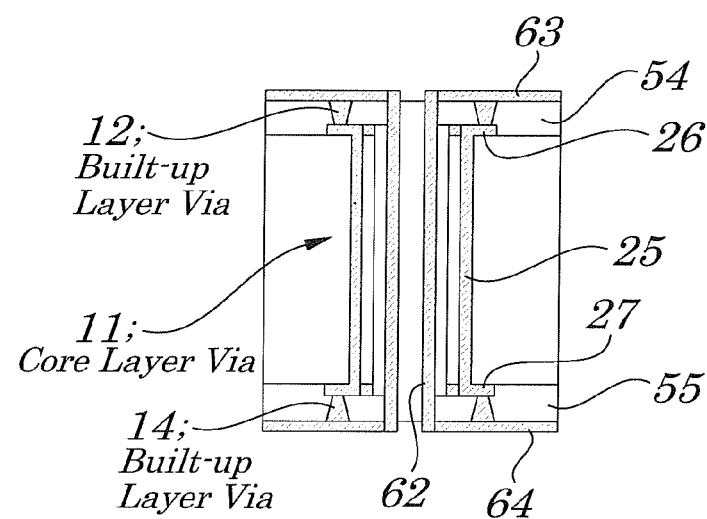
Figure 5A:
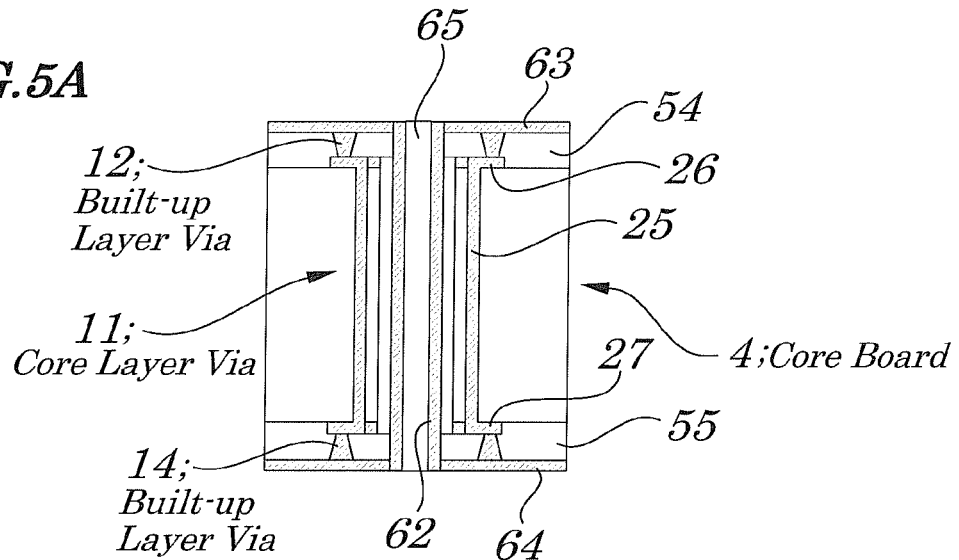
FIGS. 5A and 5B are process diagrams showing the method for manufacturing the built-up printed circuit board of FIG. 1.
Figure 5B:
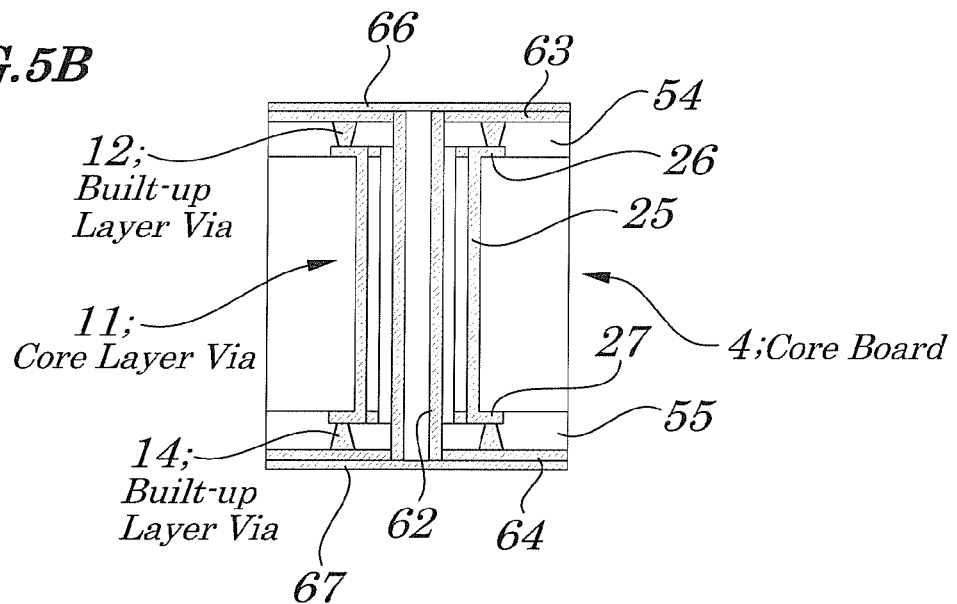
Figure 12:
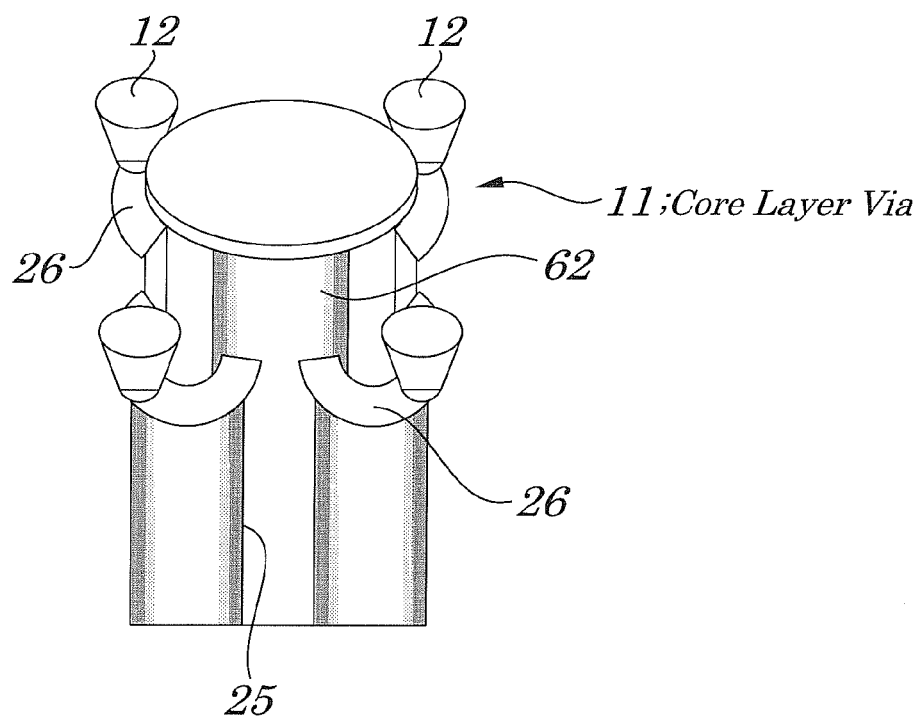
FIG. 12 is an explanatory diagram showing the method for manufacturing the built-up printed circuit board of FIG. 1.

Then, as shown in FIG. 4C and FIG. 12, a plating process is performed on an inner wall of the through-hole 58 and on surfaces of the insulating layers 54 and 55 to form built-up layer vias 12 and 14, conducting layer 62, conducting layers 63 and 64 and then, as shown in FIG. 5A, the through-hole 58 is filled with an insulator 65 made of a resin. Next, as shown in FIG. 5B, by performing a plating treatment (cap plating treatment), conducting layers 66 and 67 are formed in a manner to cover the through-hole 58, conducting layers 63 and 64.

Next, as shown in FIG. 6A, an etching process is performed on conducting layers 63 and 64 and conducting layers 66 and 67 to form conducting portions (pad) 68 and 69. Moreover, as shown in FIG. 6B, the insulating layers 71 and 72 are formed to cover conducting portions 68 and 69 and, by performing a laser punching process or a like, built-up layer vias 13a, 13b, 15a, and 15b are formed on the insulating layers 71 and 72.

Then, after conducting layers are formed by performing plating treatment on surfaces of the insulating layers 71 and 72, by performing an etching process, conducting portions (pad) are formed. Thus, at both ends of the core board 4 are formed built-up layers 5 and 6 having two-layer structures.

By assigning a ground line to each of the core layer vias 9 and by assigning a signal line to each of divided core layer via holes 11, 11, . . . , pitches among the core layer vias 9, 11, 11, . . . are made short and a ground return current path of a signal is reliably obtained, thereby suppressing high impedance. Therefore, while wiring density is improved, the built-up printed circuit board 1 enabling the transmission of high-frequency signal is achieved.

Thus, according to the first exemplary embodiment, after the core layer vias 42, 42, . . . each having a cylindrical conducting layer 43 are formed so that the conducting portions 44 and 44 (or 45 and 45) come into contact with one another, by forming the through-hole 48 having a radius being about a distance from a central axis between the above symmetric axis and each of conducting layers 43 by a punching process in a manner to pass through the core board 41 along a symmetric axis of the four core layer vias 42, 42, . . . , the core layer vias 11, 11, . . . separated from one another, and by filling the through-hole with the insulator 53 made of a resin and by performing a punching process so as to pass through the core board 41 along a central axis of the through-hole filled with the insulator 53, the through-hole 58 having a specified radius being smaller than that of the conducting layer 62 is formed and, by performing a plating treatment on an inner face of the through-hole 58, the conducting layer 62 is formed and, by forming the core layer via 9, the core layer vias 11, 11, . . . are formed around the core layer via 9 having an approximately semi-cylindrical conducting layer and, therefore, pitches among the core layer vias 9, 11, 11, . . . each having an approximately semi-cylindrical conducting layer being circular-arc shaped in cross section can be made small.

That is, unlike the conventional technology in which a minimum value for intervals among conducting portions (via lands) is limited, resulting in a limitation on intervals among the core layer vias, according to the present invention, after a plurality of core layer vias is placed in a manner in which conducting portions (via lands) come near to one another, by forming a through-hole in a central portion of each of the core layer vias for separation and insulation, pitches among the core layer vias 9, 11, 11, . . . can be made small.

Moreover, after arranging a plurality of core layer vias, by forming a through-hole in a central portion for separation and insulation, the core layer vias 11, 11, . . . are formed and, after that, by forming the core layer via 9 in a center portion and by assigning the ground wiring to the core layer via 9 in the central portion and the signal wiring to core layer vias 11, 11, . . . whose circumference is divided, when a signal passes through the core layer via 11, a path for a ground return current of the signal can be ensured in a neighboring area, thereby enabling suppression of high impedance in the transmission of high-frequency signals in particular.

Additionally, as described above, it is possible to easily manufacture the built-up printed circuit board 1 in which core layer vias 11, 11, . . . placed around the core layer via 9 by repetition of a punching process, resin filling process, metal plating process, or a like. The mounting of the built-up printed circuit board is contributable to improvement of reliability of electronic devices such as computers, communicating devices, or a like.

Second Exemplary Embodiment

FIGS. 13 to 16 are explanatory diagrams showing the method for manufacturing a built-up printed circuit board of the second exemplary embodiment of the present invention. Configurations of the built-up printed circuit board of the second exemplary embodiment differ greatly from the configurations of the first exemplary embodiment in that conducting portions (via lands) of core layer vias are overlapped. Configurations other than above are the same as those of the first exemplary embodiment and their descriptions are simplified.

Figure 13:
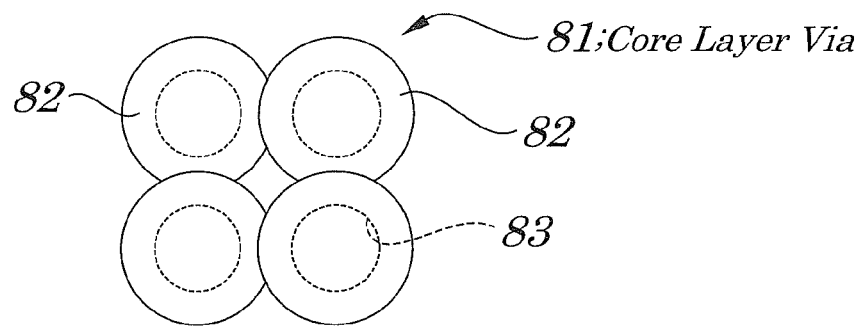
FIG. 13 is an explanatory diagram showing a method for manufacturing a built-up printed circuit board according to a second exemplary embodiment of the present invention.
Figure 14:
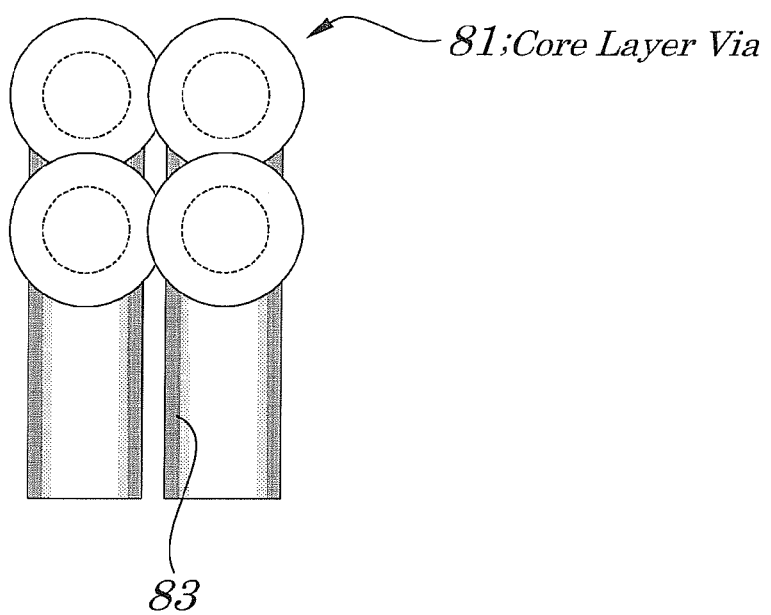
FIG. 14 is also an explanatory diagram showing the method for manufacturing the built-up printed circuit board according to the second exemplary embodiment of the present invention.

In the method for manufacturing the built-up printed circuit board of the second exemplary embodiment, as shown in FIGS. 13 and 14, four core layer vias 81, 81, . . . are formed on a core board having a multilayer structure in which a plurality of conducting layers and a plurality of insulating layers are stacked. In each of the core layer vias 81, a conducting layer 83 made up of a metal plating layer being circular-arc shaped in cross section passing through the core board and conducting portions 82 and 82 made up of a metal plating layer are formed. Each of the core layer vias 81, 81, . . . is formed so that a central axis of a cylindrical conducting layer 83 is arranged, when seen from a plane direction, at an apex of a square and dimensions of the above square of the second exemplary embodiment are smaller than those of the first exemplary embodiment.

Figure 15:
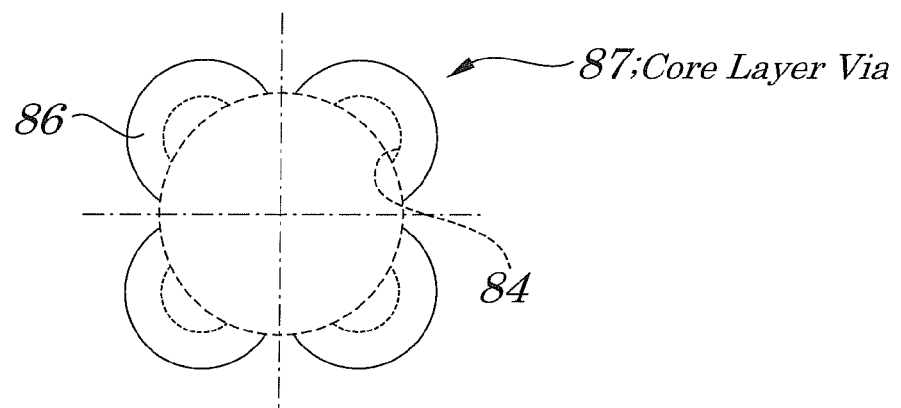
FIG. 15 is also an explanatory diagram showing the method for manufacturing the built-up printed circuit board according to the second exemplary embodiment of the present invention.
Figure 16:
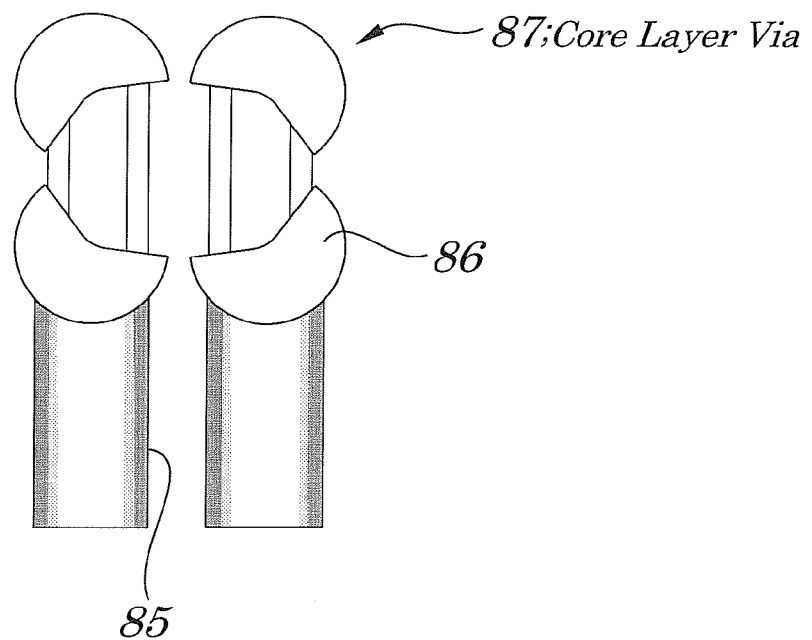
FIG. 16 is also an explanatory diagram showing the method for manufacturing the built-up printed circuit board according to the second exemplary embodiment of the present invention.

Next, as shown in FIGS. 15 and 16, by using a drill, a punching process is performed so that a hole passes through the core board along a symmetric axis (axis passing through a center of the above square) of the four core layer vias 81, 81, . . . a through-hole 84 having a radius being about a distance between the above symmetric axis and a central axis of each of the conducting layers 83 is formed. As a result, as shown in FIGS. 13 and 14, regions on the above symmetric axis side of the conducting layer 83 and conducting portions 82 of the core layer vias 81, 81, . . . are scooped out and the core layer vias 81, 81, . . . pass through the core board and core layer vias 87, 87, . . . each having a conducting layer 85 being circular-arc shaped in cross section are formed so that a concave surface of the conducting layer 85 is directed on the symmetric axis and conducting portions 86, 86 made up of a metal plated layer formed at both ends of the conducting layer 85 are formed in a state separated from one another.

According to the second exemplary embodiment, the approximately same effect as obtained in the first exemplary embodiment can be achieved. Additionally, pitches among core layer vias can be made further smaller.

Third Exemplary Embodiment

Figure 17:
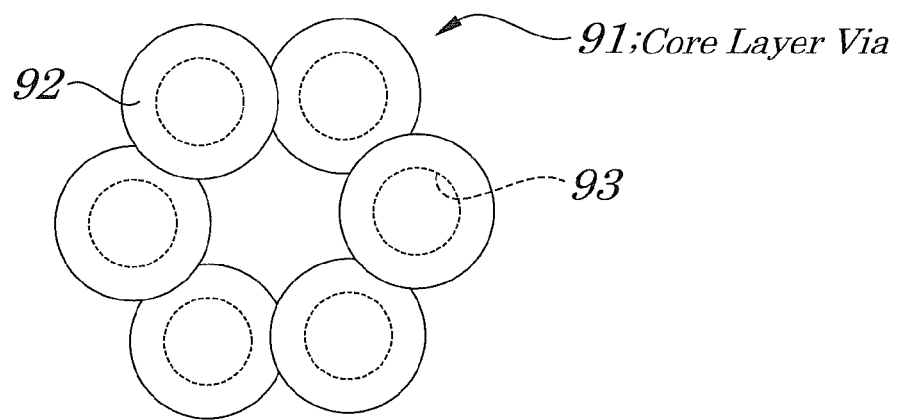
FIG. 17 is an explanatory diagram showing a method for manufacturing a built-up printed circuit board according to a third exemplary embodiment of the present invention.
Figure 18:
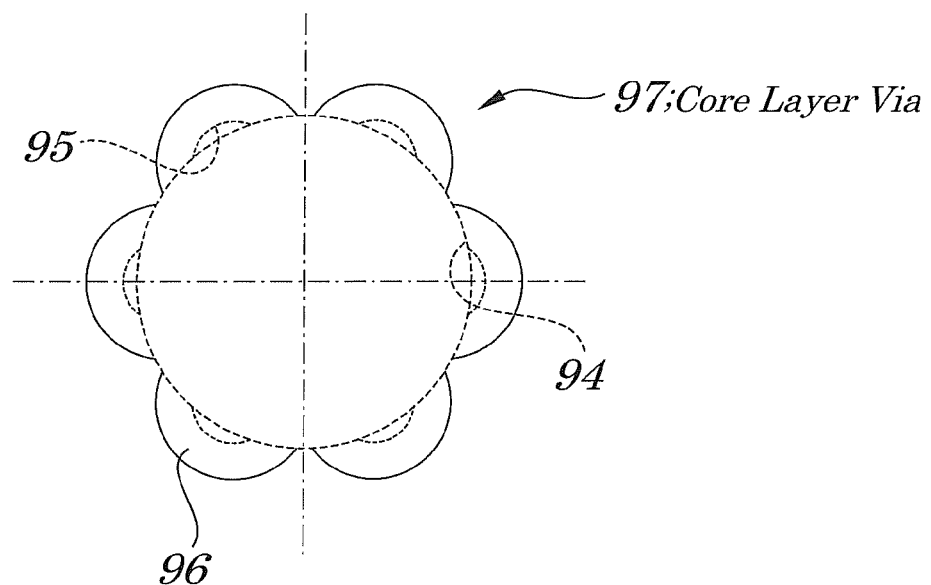
FIG. 18 is also an explanatory diagram showing a method for manufacturing a built-up printed circuit board according to the third exemplary embodiment of the present invention.
Figure 19:
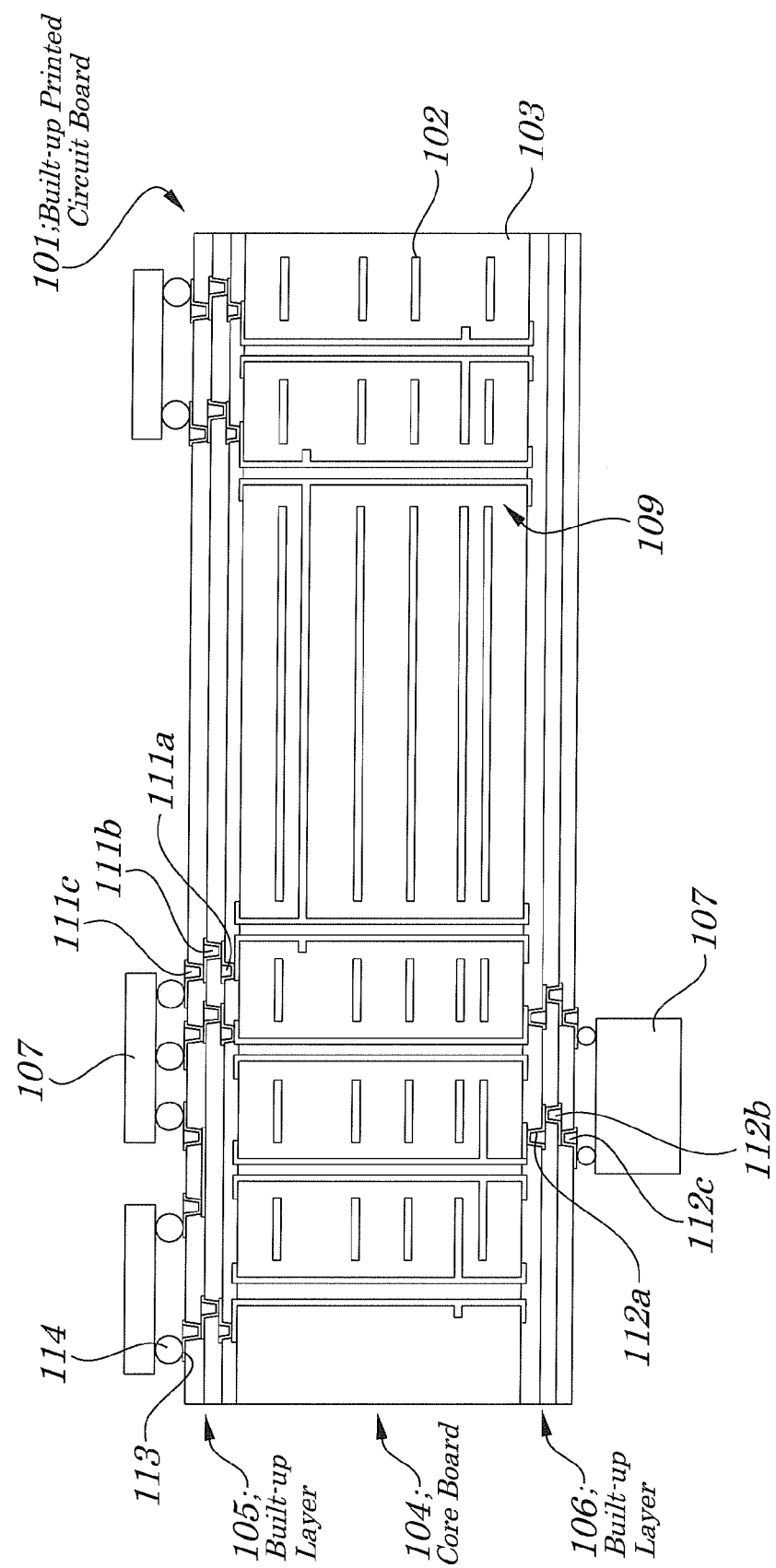
FIG. 19 is an explanatory diagram showing conventional technology.

FIGS. 17 and 18 are an explanatory diagram showing a method for manufacturing a built-up printed circuit board of the third exemplary embodiment of the present invention. Configurations of the built-up printed circuit board of the third exemplary embodiment differ from those of the second exemplary embodiment in that six core layer vias are arranged in an overlapped manner. Configurations other than above are the same as those of the second exemplary embodiment and their descriptions are omitted accordingly.

In the method of manufacturing the built-up printed circuit board of the third exemplary embodiment, first, as shown in FIG. 17, on the core board having a multilayer structure in which a plurality of conducting layers and a plurality of insulating layers are stacked are formed six core layer vias 91, 91, . . . so that conducting portions 92 and 92 are overlapped. Each of the core layer vias 91 has a conducting layer 93 made up of a metal plated layer being cylindrical in cross section passing through the core board and at both ends of each of the core layer vias 91 are formed conducting portions 92, 92 made up of a metal plated layer. Each of the core layer vias 91, 91, . . . is formed so that a central axis of the cylindrical conducting layer 93 is arranged, when seen from a plane direction, at an apex of a regular hexagon.

Next, by performing a punching process, using a drill, along asymmetric axis (axis passing through a center of the above regular hexagon) of the six core layer vias 91, 91, . . . so as to pass through a core board, a through-hole 94 is formed which has a radius being about a distance from a central axis between the above symmetric and each of conducting layers 93. As a result, as shown in FIGS. 17 and 18, regions on the above symmetric axis side of the conducting layer 93 and conducting portions 92 of the core layer vias 91, 91, . . . are scooped out and the core layer vias 91, 91, . . . pass through the core board and core layer vias 97, 97, . . . each having a conducting layer 95 being circular-arc shaped in cross section formed so that a concave surface of the conducting layer 95 is directed on the symmetric axis and conducting portions 96, 96 made up of a metal plated layer formed at both ends of the conducting layer 95 are formed in a state separated from one another.

According to the second exemplary embodiment, approximately the same effect as obtained in the first exemplary embodiment can be achieved. Additionally, pitches among core layer vias can be made further smaller.

It is apparent that the present invention is not limited to the above exemplary embodiments but may be changed and modified without departing from the scope and spirit of the invention. For example, in the above exemplary embodiments, the core layer vias are arranged so as to be square-shaped or regular-polygonal shaped, however, the present invention is not limited to these and the core layer vias can be arranged so as to be of a regular triangle and/or octagon and, generally, a plurality of core layer vias may be placed so as to be of a regular polygon and may be arranged non-symmetrically. Moreover, a size of each of the core layer vias and a distance from a central axis may not be constant.

Also, for example, six core layer vias may be placed within a rectangular framework and a core layer via making up, for example, two ground wirings may be placed within these core layer vias. Moreover, a size of the core layer via for a signal wiring may be set which is larger than that of the ground wiring. Additionally, the technology of the present invention can be applied to mounting of not only SMDs but also through-hole mounting devices.

Also, in the first exemplary embodiment, the size of the through-hole formed in the central portion is not limited to the radius being about a distance between the above symmetric axis and a central axis of each of the conducting layers of each of the four core layer vias and the size may be larger or smaller than that. Moreover, in the first exemplary embodiment, the core layer vias are formed in a manner in which conducting portions (via lands) of the core layer vias being adjacent to one another come in contact with one another (FIG. 3A), however, the present invention is not limited to this and the conducting portions may come near to one another within a specified distance (for example, to an extent to which conducting portions are on the brink of coming into contact). Thus, by avoiding contact among conducting portions, in the case of design using CAD, since short treatment is not employed, it is possible to do easy and rapid designing. Furthermore, in the second exemplary embodiment, the distance among the disposed core layer vias, so long as core layer vias are separated by the through-hole formed in the center and insulation among core layer vias are ensured, may be further shorter.

The present invention may be applied not only to a core board of a built-up layer, generally, but also to a through-hole and/or via hole of multilayer printed circuit board.

What is claimed is:

1. A method for manufacturing a multilayer printed circuit board on which electrical devices are mounted and a plurality of insulating layers and a plurality of conducting layers alternately are stacked and conducting paths are formed along an approximately vertical direction to the conducting layers, said method comprising: a conducting path forming process of forming said conducting paths on a board on which the plurality of insulating layers and the plurality of conducting layers are alternately stacked and forming a plurality of first conducting paths passing through said board and second conducting paths also passing through said board so as to be surrounded by said plurality of first conducting paths, wherein said conducting path forming process comprises a first process of forming a plurality of cylindrical or pillar-shaped conducting portions at both ends of each main body of which edge conducting portions are formed on said board so that said edge conducting portions being adjacent to one another come near to or come into contact with one another at least within a specified distance, a second process of punching a center portions of regions in which the plurality of conducting portions is placed so that partial portions on center portion sides of said edge conducting portions are removed and so that said edge conducting portions being adjacent to one another are at least separated to form first through-holes so as to form said first conducting paths, a third process of forming, after said first through-holes are filled with an insulator, second through-holes each having a cross-sectional dimension being smaller than that of each of said first through-holes within said first through-holes filled with said insulator, and a fourth process of forming conducting layers in inner walls of said second through-holes so that said second conducting paths are formed.

2. The method for manufacturing the multilayer printed circuit board according to claim 1, wherein, in said first process, said plurality of first conducting portions is formed so that said edge conducting portions being adjacent to one another come into contact with one another.

3. The method for manufacturing the multilayer printed circuit board according to claim 2, wherein said edge conducting portions formed in said first process comprise approximately circular lands and, in said first process, said plurality of first conducting portions are formed so as to be overlapped by circular arcs each containing a circumference of each of said lands being adjacent to one another.

4. The method for manufacturing the multilayer printed circuit board according to claim 1, wherein, in said first process, said plurality of first conducting portions is arranged annularly in places surrounding central portions.

5. The method for manufacturing the multilayer printed circuit board according to claim 1, wherein said first conducting paths serve as signal wirings and said second conducting paths serve as ground wirings.

6. The method for manufacturing the multilayer printed circuit board according to claim 1, wherein, on upper surface sides and lower surface sides of said board serving as a core board are formed built-up layers.

7. The method for manufacturing the multilayer printed circuit board according to claim 1, wherein connecting terminals mounted on surface mount devices (SMDs) being said electrical devices are connected to the specified conducting layers through said first conducting paths and said second conducting paths.

8. A multilayer printed circuit board on which electrical devices are mounted and a plurality of insulating layers and a plurality of conducting layers alternately are stacked and conducting paths are formed along an approximately vertical direction to the conducting layers, comprising: a plurality of conducting paths formed on a board on which the plurality of insulating layers and the plurality of conducting layers are alternately stacked which make up said conducting paths and pass through said board; and second conducting paths surrounded by said plurality of first conducting paths, wherein, at both ends of each cylindrical and pillar-shaped main body of first conducting paths and second conducting paths are formed edge conducting portions, wherein, in said plurality of first conducting paths, said edge conducting portions being adjacent to one another are arranged so as to be separated from one another and said second conducting paths are placed in center portions of regions in which each of said plurality of first conducting portions is arranged with a specified distance kept from each of said first conducting paths, and wherein each of portions in said center portions of circumferences of at least said edge conducting portions of said first conducting paths is formed so as to have a shape corresponding to a shape of a circumference of said edge conduction portions of said second conduction paths with said specified distance kept from said second conducting paths.

9. The multilayer printed circuit board according to claim 8, wherein said edge conducting portions of said first conducting paths are formed so that portions in said center of each of approximately circular lands of said edge conducting portions are removed and said plurality of first conducting paths is formed so that partial portions of circular arcs each containing a circumference of each of said lands being adjacent to one another come into contact with one another or overlap.

10. The multilayer printed circuit board according to claim 8, wherein said plurality of first conducting paths is arranged annularly in portions surrounding said center portions.

11. The multilayer printed circuit board according to claim 8, wherein said first conducting paths make up signal wirings and said second conducting paths make up ground wirings.

12. The multilayer printed circuit board according to claim 8, wherein, on upper surface sides and lower surface sides of said board serving as a core board are formed built-up layers.

13. The multilayer printed circuit board according to claim 8, wherein connecting terminals mounted on surface mount devices (SMD) being said electrical devices are connected to the specified conducting layers through said first conducting paths and said second conducting paths.

\* \* \* \* \*